(12) United States Patent
Radloff (10) Patent No.: US 6,220,915 B1
(45) Date of Patent: Apr. 24, 2001

(54) METHOD FOR MANUFACTURING LAMP TILES

(75) Inventor: Robert Peter Radloff, Corona, CA (US)

(73) Assignee: Handy & Harman, Fairfield, CT (US)

( * ) Notice: Subject to any disclaimer, the term of this patent is extended or adjusted under 35 U.S.C. 154(b) by 0 days.

(21) Appl. No.: 09/559,545

(22) Filed: Apr. 28, 2000

Related U.S. Application Data (62) Division of application No. 09/172,760, filed on Oct. 15, 1998, now Pat. No. 6,087,195.

(51) Int. Cl.[7] .................................................. B29C 70/84
(52) U.S. Cl. ............................................. 445/60; 425/123
(58) Field of Search .................. 445/24, 60; 425/123

(56) References Cited

U.S. PATENT DOCUMENTS

| | | | |
|---|---|---|---|
| 3,859,718 | 1/1975 | Noe | 29/591 |
| 3,862,476 | 1/1975 | Kuchinsky et al. | 29/25.16 |
| 4,209,358 | 6/1980 | DiLeo et al. | |
| 4,939,375 | * 7/1990 | Walters et al. | 250/551 |
| 4,949,156 | 8/1990 | Mii | 357/68 |
| 4,951,119 | 8/1990 | Yonemochi et al. | 357/70 |
| 5,068,206 | 11/1991 | Kurita et al. | 437/220 |
| 5,119,174 | * 6/1992 | Chen | 257/98 |
| 5,147,815 | 9/1992 | Casto | 437/51 |
| 5,163,241 | 11/1992 | Blaeser et al. | |
| 5,177,593 | * 1/1993 | Abe | 257/98 |
| 5,333,375 | 8/1994 | Dennis et al. | 29/827 |
| 5,339,518 | 8/1994 | Tran et al. | 29/827 |
| 5,365,409 | 11/1994 | Kwon et al. | 361/813 |
| 5,403,784 | 4/1995 | Hashemi et al. | 437/217 |
| 5,452,511 | 9/1995 | Chang | 29/827 |
| 5,506,174 | 4/1996 | Vandeheuvel et al. | 437/209 |
| 5,534,718 | * 7/1996 | Chang | 257/98 |
| 5,535,509 | 7/1996 | Tomita et al. | 29/827 |
| 5,564,819 | 10/1996 | Yamaguchi | 362/241 |
| 5,660,461 | * 8/1997 | Ignatius et al. | 362/241 |
| 5,786,665 | 7/1998 | Ohtsuki et al. | 313/512 |
| 5,909,037 | 6/1999 | Rajkomar et al. | 257/99 |
| 5,923,536 | 7/1999 | Lumbard | 361/752 |
| 6,139,304 | * 10/2000 | Centofante | 425/121 |

\* cited by examiner

*Primary Examiner*—Kenneth J. Ramsey
(74) *Attorney, Agent, or Firm*—Pennie & Edmonds LLP (57) ABSTRACT

A method and system for fabricating lamp tiles which include a molded body and a plurality of electrically conductive leads protruding therefrom. The lamp tiles are made by overlaying an anode lead frame having anode leads, on a cathode lead frame having cathode leads, and then depositing molding material on intersected anode and cathode leads. The lamp tiles are manufactured in an assembly line process which includes a feeder to feed the anode and cathode lead frames and a molder to deposit the molding material.

10 Claims, 6 Drawing Sheets

METHOD FOR MANUFACTURING LAMP TILES

This is a divisional of application Ser. No. 09/172,760, filed Oct. 15, 1998, now U.S. Pat. No. 6,087,195.

FIELD OF THE INVENTION

This invention relates to an automated manufacturing of lamp tiles and, more specifically, to manufacturing of the lamp tiles from a plurality of lead frame reels in an assembly line process.

BACKGROUND OF THE INVENTION

Small light lamps such as light emitting diodes (LEDs) have been widely used as indicators or components of displays because of their high mechanical stability, low operating voltage, and long service life. When a plurality of the small light lamps are arranged in a two dimensional array and inserted into an electrically wired board configured to control each lamp, the resulting structure forms a large display board. In one prior system, such large display boards have been employed as score boards in sports arenas.

Manufacturing of display boards requires wiring of internal electrical circuit for controlling each lamp and wiring sockets for receiving each lamp. The lamps also must be individually inserted into the sockets. The preceding requirements, among others, make the manufacturing of display boards to be cumbersome and not readily adaptable to an automated assembly line processing. In turn, the display boards are ordinarily custom designed with high manufacturing costs.

SUMMARY OF THE INVENTION

The present invention is directed to a method and apparatus for manufacturing lamp tiles. A lamp tile is a panel which has a plurality of light openings into which small light lamps are inserted and which includes a plurality of anode and cathode leads electrically connected to anode and cathode ends of corresponding small lamps for supplying or cutting off electrical power to the lamps. The lamp tiles are mounted into a display board configured to receive the anode and cathode leads of the lamp tiles. Such a display board also includes control circuit to control the on/off states of each lamp of the lamp tiles.

By using the present invention, the manufacturing process of display boards is simplified by bypassing, among other things, the requirement of wiring individual sockets to receive each lamp into the display board because lamps are already mounted in the lamp tiles. Furthermore, since lamp tiles have standard sizes and since the lead frames are designed such that they are adopted to be mass produced, the lamp tiles are produced in an assembly line. These and other advantages provided in this invention reduces the overall costs of manufacturing the display boards.

Specifically, the present invention relates to a method for fabricating at least one lamp tile having a molded body and a plurality of electrically conductive leads protruding therefrom, by providing a first lead frame segment defining a first aperture and including at least one first lead extending into the first lead frame aperture; providing a second lead frame segment defining a second aperture and including at least one second lead extending into the second lead frame aperture; overlaying the first and second lead frame segments above the other such that the first and second leads form an intersection in a plan view of the overlaid lead frame segments, and the first and second leads are spaced apart from each other at the intersection by a predetermined distance in a side view of the overlaid lead frame segments; and depositing molding material in a predetermined pattern on the intersection, thereby forming the molded body wherein a portion of the first lead protrudes from the deposited molding material, and a portion of the second lead protrudes from the deposited molding material.

This method includes forming a light opening over the intersection exposing portions of the first and second leads and trimming the first and second leads from the first and second lead frame segments. The step of overlaying the first and second leads includes the step of setting the predetermined distance to be between 0.01 and 0.03 inches, and preferably, between 0.01 and 0.015 inches, and the step of depositing the molding material includes the step of selecting the molding material to be a heat treatable nylon which is heat treatable at a temperature of at least 300°C.

Preferably, the first frames segment are produced by the step of stamping the first lead frame segments on a first elongated sheet made of electrically conductive rigid material, and the second frame segments are made by the step of stamping the second lead frame segments on a second elongated sheet made of electrically conductive rigid material. The method preferably includes the step of depositing epoxy material between first and second leads over the intersections.

The invention also relates to a system for fabricating a plurality of lamp tiles, comprising a plurality of first lead frame segments which define first apertures and include a plurality of first leads extending into the first lead frame apertures; a plurality of second lead frame segments which define second apertures and including a plurality of second leads extending into the second lead frame apertures; a plurality of pins configured to overlay one of the first and second lead frame segments; a feeder for receiving the plurality of first and second lead frame segments and for overlaying the plurality of pins on one of the first and second lead frame segments such that corresponding the first and second leads form an array of intersections in a plan view of the overlaid lead frame segments, and are spaced apart from each other at each intersection by a predetermined distance in a side view of the overlaid lead frame segments; and a molder configured to deposit molding material in a predetermined pattern on a plurality of the intersections such that a portion of each corresponding the first lead protrudes from the deposited molding material, and a portion of each corresponding the second lead protrudes from the deposited molding material.

The system preferably includes a trimmer configured to cut the first and second leads from the first and second lead frame segments, a first stamping device configured to stamp the first lead frame segments on a first elongated sheet made of electrically conductive rigid material, and a second stamping device configured to stamp the second lead frame segments on a second elongated sheet made of electrically conductive rigid material.

DETAILED DESCRIPTION OF THE PREFERRED EMBODIMENTS

Figure 1:
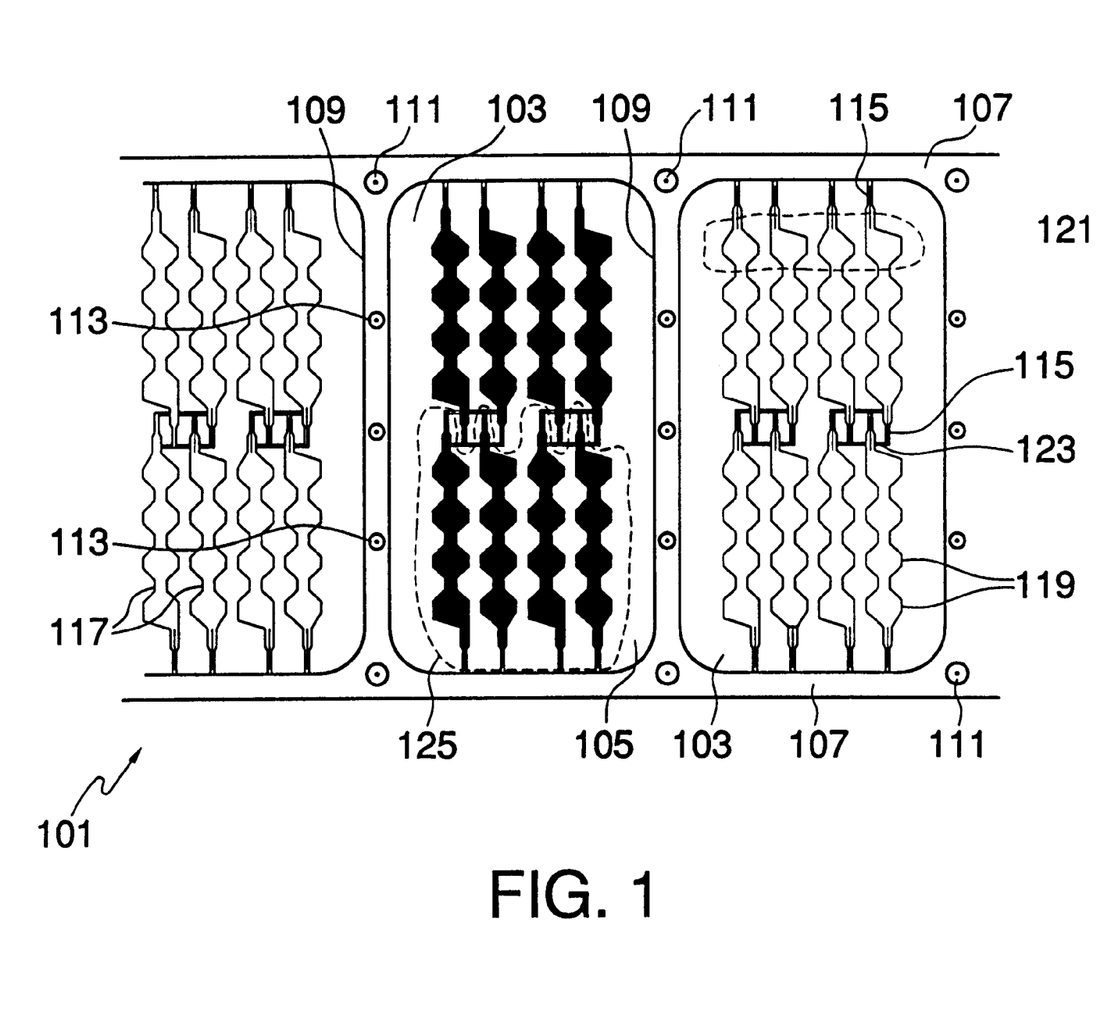
FIG. 1 is a plan view of a portion of a cathode lead frame, which includes three lead frame segments of the cathode lead frame.

Referring to FIG. 1, a cathode lead frame 101 includes a plurality of lead frame segments 103. Each lead frame segment 103, in turn, has a cathode lead aperture 105 delineated by side portions which include a pair of side rails 107 and crossbars 109. The pair of spaced apart side rails 107 are connected to and supported by the crossbars 109. Cathode feeder holes 111, regularly spaced, are formed in the side rails 107, and cathode lead alignment holes 113 are formed in the crossbars 109. Each cathode lead frame segment 103 also includes a plurality of cathode leads 117 attached to the side portions and extending into the cathode lead aperture 105. Blackened portions in FIG. 1 illustrate two sets of cathode leads 125.

The cathode lead frame 101 is made substantially from copper. Any electrically conductive rigid material, however, is adequate for making the cathode lead frame 101. The rigid material is formed into an elongated sheet which is, then, nickel plated. The thickness of the elongated sheet is on the range of 5–20/1,000 inches and, preferably, 10–15/1,000 inches. The nickel plated sheet, in turn, is preferably gold plated. In other embodiments, the nickel plated sheet is plated with palladium, silver or any electrically conductive precious metal.

The cathode lead frame segments 103 are formed in the elongated sheet, preferably, by a stamping process and, alternatively, by an etching process, both of which are known processes in the art. The elongated sheet is sufficiently lengthy to form at least a thousand lead frame segments and, preferably, more than five thousand lead segments.

In one aspect of the preferred embodiment, the cathode lead frame aperture 105 has a substantially rectangular shape. In alternative embodiments, the cathode lead frame aperture 105 is a square, circle or any shape that allows formation of a plurality of cathode leads.

In another aspect of the preferred embodiment, each cathode lead 117 has two lead ends 115. One of the lead ends 115 is attached to the side rails 107 and the other is attached to respective connecting members 123. The connecting members 123 are provided to render support between the two different sets of cathode leads 125 which eventually become parts of two lamp tiles. In other words, two lamp tiles are formed from each cathode lead frame segment 103. In other embodiments, various numbers of sets of cathode leads are provided, such as four sets in a two by two array, six sets in a three by two array, or eight in a four by two array. In these embodiments, however, the number of sets of cathode leads provided in a cathode lead frame segment is limited since stringing too many of them together by connecting members would not maintain structural integrity of the cathode lead frame.

In yet another aspect of the preferred embodiment, each set of cathode leads 125 includes four cathode leads 117, each cathode lead 117 including four bubble shaped nodes 119 arranged to form four arrays of neighboring nodes 121. Each node 119 comes in contact with a cathode end of a lamp, as will be discussed later. The bubble shape is provided for good electrical contact between it and the cathode end of a lamp. In alternative embodiment, nodes with different shapes are provided and the only requirement on the shape of the nodes is that they provide good contacts to respective cathode ends of lamps. In one alternative embodiment, a small depression or bump is formed in each of the nodes in order to achieve a good contact with a cathode end.

In other alternative embodiments, different number of cathode leads 117 are provided for each set of cathode leads 125, and different number of nodes 119 are provided for each cathode leads 117. In one exemplary embodiment, six cathode leads for each set of cathode leads and six nodes for each cathode lead are provided. In another exemplary embodiment, four cathode leads for each set of cathode leads and six nodes for each cathode lead are provided. As the preceding exemplary embodiments illustrate, the number of cathode leads in a set of cathode leads and the number of nodes for each cathode lead are not limited to a four by four array as shown in FIG. 1.

Figure 2:
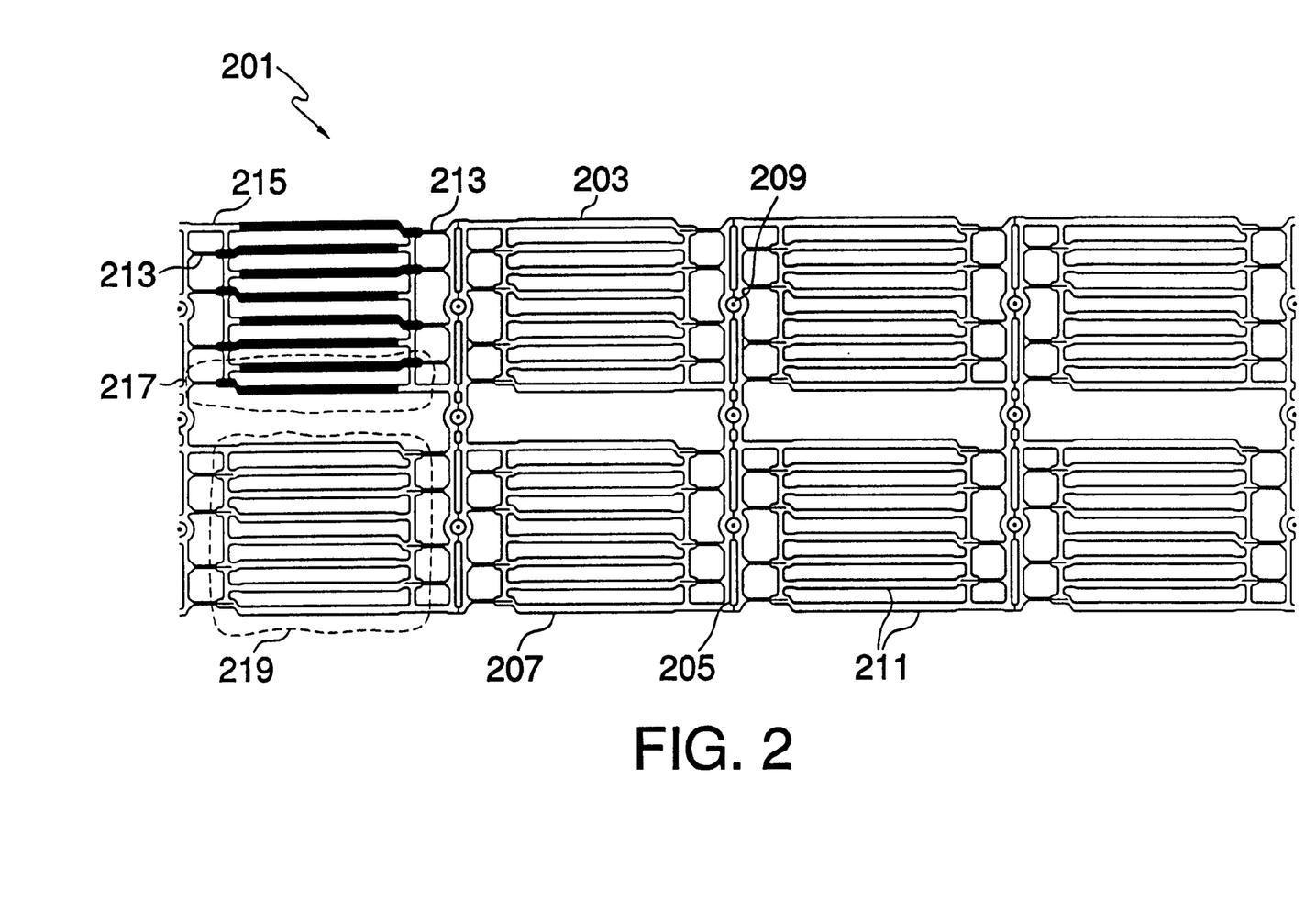
FIG. 2 is a plan view of a portion of an anode lead frame, which includes four lead frame segments of the anode lead frame.

Now referring to FIG. 2, an anode lead frame 201 includes a plurality of anode lead frame segments 203. Each anode lead frame segment 203 includes anode crosspieces 205, which delineates individual lead frame aperture 207. Each anode crosspiece 205 includes anode alignment holes 209. In addition, each anode lead frame segment 203 includes a plurality of anode leads 211. Each anode lead 211 in turn has two anode lead ends 213 one of which is connected to the anode crosspieces 205 and the other one of which is connected to connecting members 215. Two neighboring anode leads form a pair of anode leads 217. Each set of anode leads 219 includes four pairs of anode leads 217 corresponding to the four arrays of neighboring nodes 121 of each set of cathode leads 125 in FIG. 1.

In one aspect of the preferred embodiment, the anode lead frame is made from substantially the same material and by substantially the same process as that of the cathode lead frame 101. In an alternative embodiment, the anode lead frame is made from different electrically conductive rigid material or made by a different process than that of the cathode lead. In addition, other alternative embodiments in connection with the number of anode lead frames, the shape of anode aperture, the number of sets of anode leads per anode lead frame segment, the number of pairs of anode leads per anode set of anode leads, and the shape of anode leads have similar options available to them as that of cathode lead frame 101 and its corresponding parts.

In another aspect of the preferred embodiment, no side rail similar to the cathode side rails 107 is provided to the anode lead frame. In alternative embodiments, side rails are provided to enhance the structural integrity of the anode lead frame 201.

Figure 4:
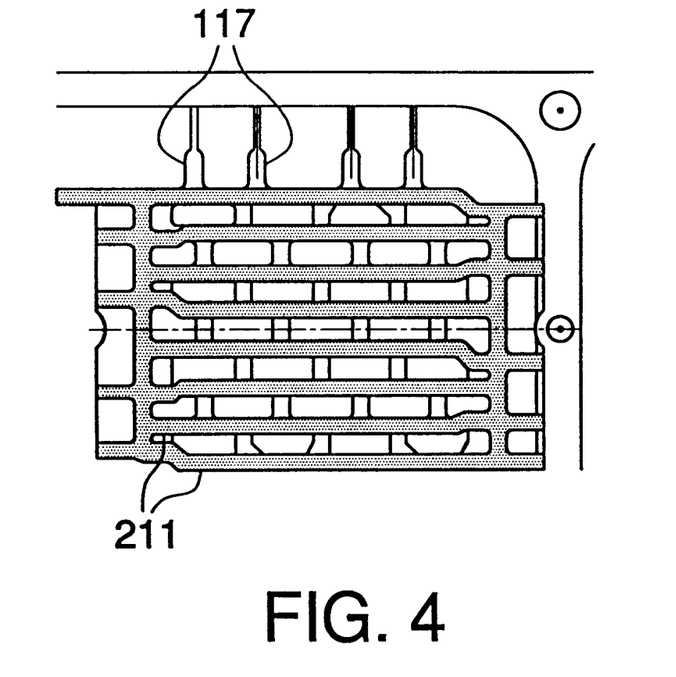
FIG. 4 is a plan view of one set of anode leads overlaid on top of one set of cathode leads.

Referring to FIG. 4, in a plan view, when the anode alignment holes 209 are co-located with the alignment holes 113 in the cathode lead frame 101, each pair of anode leads 217 intersect with corresponding array of nodes 121 of the cathode lead frame 101. This arrangement allows individualized control of lamps in contact with each node of the cathode leads and anode leads as discussed later in more detail.

The intersections between the cathode and anode leads 117, 211 form a two dimensional array. More specifically, the anode and cathodes leads 117, 211 perpendicularly intersect with each other. In alternative embodiments, the anode and cathode leads do not cross each other perpendicularly. Instead, the anode and cathode leads intersect each other in an angle other than 90 degrees. In these alternative embodiments, the cathode leads or anode leads extend at an angle into the cathode lead frame aperture and the anode lead frame aperture, respectively. These alternative embodiments are possible as long as individual control of the light lamps can be performed which will be discussed later.

Figure 3:
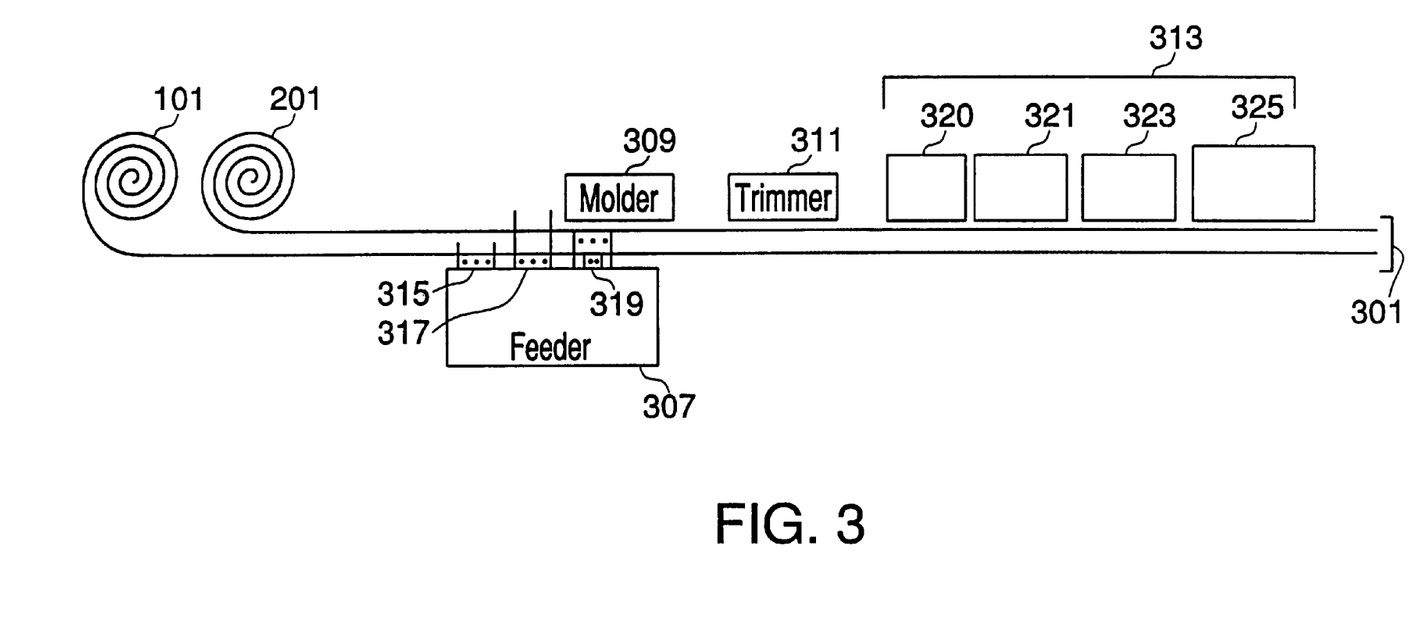
FIG. 3 is an overview of an automated assembly line for manufacturing lamp tiles.

Now referring FIG. 3, a manufacturing assembly line 301 includes an anode lead frame 201, a cathode lead frame 101, a feeder 307, a molder 309, a trimmer 311 and a post processor 313. The feeder 307 has a plurality of cathode feed pins 315, a plurality of alignment pins 317 and a plurality of precision positioning pins 319. In an alternative embodiment, two stamping devices are provided (not shown in FIG. 3) for stamping cathode and anode lead frames in two elongated sheets of metal.

The anode lead frame 201 is rolled up into a anode reel, and the cathode lead frame 101 is rolled up into a cathode reel. The anode and cathode reels are unrolled to feed their respective lead frames into the feeder 307.

The cathode feeder pins 315, configured to fit into the feeder holes 111 in the cathode lead frame 101, are inserted into the feeder holes 111. Subsequently, the alignment pins 317, configured to fit into the alignment holes 113 in the cathode lead frame 101 and fit into the anode alignment holes 209 in the anode lead frame 201, are inserted into the alignment holes 113, 209. Once the alignment pins are fitted into the alignment holes 113, 209, the cathode lead frame 101 and anode lead frame 201 are overlaid and aligned. The combination of the cathode feeder pins 315 and the alignment pins 317 move the cathode and anode reels 101, 201 along the assembly line 301.

In alternative embodiments, the cathode lead frame holes and the cathode alignment holes and the anode alignment holes are not provided. In these embodiments, the cathode feeder pins 315 and the alignment pins 317 feed and align the cathode and anode lead frames 101, 201 by using side rails 107, crossbars 109 and crosspieces 205.

Figure 5:
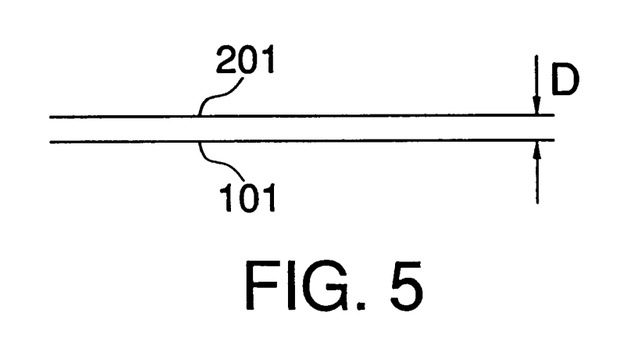
FIG. 5 is a side view of an anode lead frame overlaid on top of a cathode lead frame.

The precision positioning pins 319 place the anode lead frame 201 apart from the cathode reel 101 by a distance on the range of 10–30/1,000 inches, and, preferably, on the range of 10–15/1,000 inches. The distance is designated as D in FIG. 5. In any event, the minimum distance is electrical conductivity between the anode and cathode leads, and the maximum distance is controlled by the lamp design. For example, if the distance between the anode and cathode leads is too large than the cathode and anodes of lamps may not be connected to the cathode and anode leads efficiently.

The distance between the cathode lead frame 101 and the anode lead frame 201 is maintained when they are fed into the molder 309. The molder 309 then deposits molding material onto the respective lead frame portions of the cathode reel 101 and anode reel 201 in a predefined pattern. The molding material is a high temperature nylon and is, preferably, Amodel® resin, a product manufactured by Amoco. Amodel® resin is a high temperature nylon which can withstand up to 570° F. without being deformed. However, any other material which can be molded and has high temperature tolerance is adequate.

In one aspect of the preferred embodiment, the molding material is deposited between the anode and cathode leads where they intersect with other. In an alternative embodiment, some potting material such as epoxy material is deposited between the anode and cathode leads where they are at the intersections. This alternative embodiment enhances the bonding between the anode and cathode leads and, depending on the material used, may reduce the occurrences of shorting between the anode and cathode leads.

Figure 6:
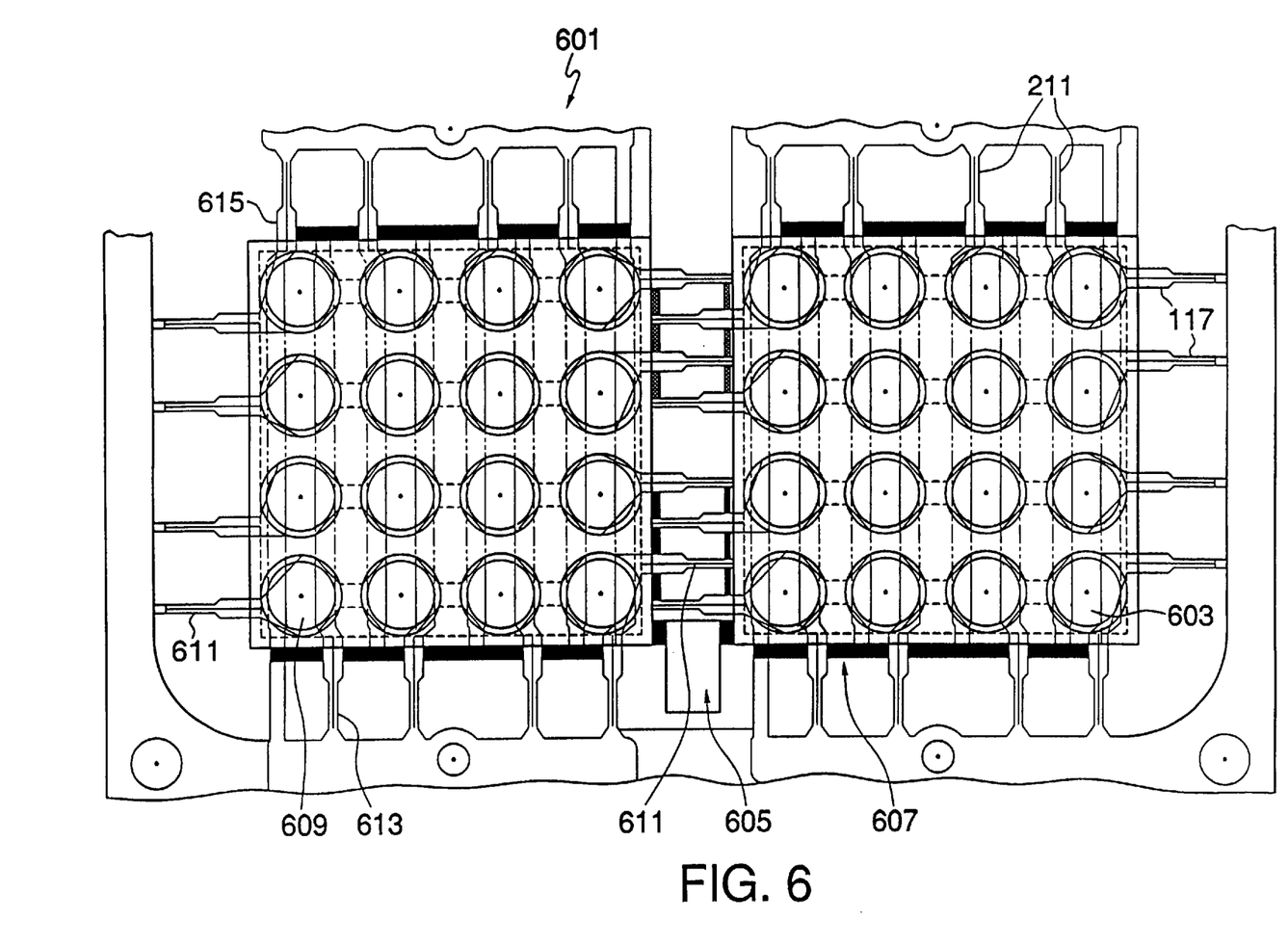
FIG. 6 is a plan view of molded lamp tiles.

Referring to FIG. 6, in the molder 309 each lamp tile 601 is formed within the predefined pattern. The predefined pattern includes a set of dam-bars 607 and gate trims 605 and a set of cylindrically shaped cores (not shown) placed where light openings 603, also referred as light pipes, are to be formed. The light openings 603 are disposed in the functioning side, as shown in FIG. 6. In alternative embodiments, a set of conically or parabolically shaped cores or a set of rectangular, circular or other shaped dam-bars are provided. For instance, when the parabolically shaped cores are utilized, the light openings 603 are molded into parabolic shapes that produce consistent light beams.

In one aspect of the preferred embodiment, the lamp tile has a flat panel shape. In alternative embodiment, the functioning side of lamp tile 601 may be concave, convex or sloped in one direction in order to accommodate different display board designs.

Figure 7:
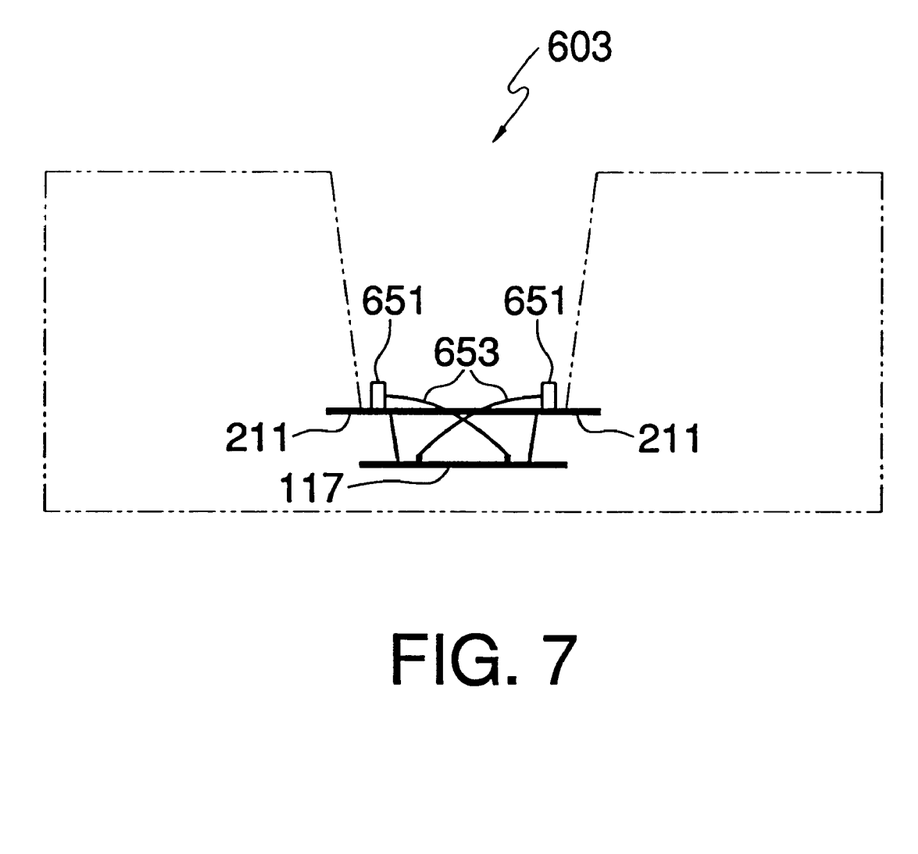
FIG. 7 is a cross-sectional view of a light opening.

Referring to FIG. 7, a light opening 603 exposes portions of a pair of anode leads 211 and a corresponding node 117 of the cathode leads 119. When light lamps 651 are disposed in the light openings 603, the cathode end of each lamp 651 makes a contact with a corresponding exposed portion of the cathode node 117, and the anode end of each lamp makes a contact with corresponding exposed portion of anode lead 211.

The contacts between ends of a light lamp and exposed portions of the leads are, preferably, established by a wire bonding process. In the wire bonding process, thin wires 653 are provided to establish the electrical connections. Subsequently, the light opening is, preferably, filled with clear epoxy material and, alternatively, is not filled with any material.

The anode and cathode leads function as switches for the inserted light lamps. In other words, one combination of an anode and a cathode function as one switch and the other combination functions as a second switch.

In one of the preferred embodiments, the inserted light lamps are capable of displaying three different colors: green, red and white. This is achieved by providing two different colored lamps, green and red, into each of the light openings. The on/off states of each the lamp is controlled by the pair of anodes and cathodes switches. More specifically, one anode and cathode combination controls the on/off states of green colored lamp and the other combination controls the on/off states of red colored lamp. Furthermore, when both of them are in the on state, then the resulting light beam is the white color.

In an alternative embodiment, single color light lamps are utilized. In this embodiment, its anode leads do not need to be paired up as described by referencing FIGS. 1 and 2, since only one combination of an anode and cathode leads are required. Furthermore, when the size and shape of light lamps change, the size and shape of the nodes of cathode leads and light openings change as well to accommodate different light lamps.

In the embodiment depicted in FIG. 6, each lamp tile is provided with sixteen sets of switches, each set with two switches. Each switch is controlled by supplying electrical power to or cutting off the electrical power from corresponding lead ends extending beyond the molding material of the corresponding lamp tile. For instance, a light opening 609 exposes a portion of a node of cathode lead 611 which has two ends extending outside of the molded body and a portion of a pair of anode leads 613 and 615 each of which has one end. Therefore, in the preceding configuration, a lamp inserted into the light opening 609, its anode and cathode ends electrically connected to the corresponding anode leads 613, 615 and cathode lead 611, is controlled by supplying electrical power to or cutting off the power to respective lead ends. In the similar manner, all of the inseted light lamps are switched on or off.

In other alternative embodiments, the resulting light opening array can be different from a four by four array since a simple change in the structure of the lead frames can allow the resulting tile to have any size array including a non square array as described above in reference with FIG. 1.

Referring back to FIG. 3, the trimmer cuts individual lamp tiles from the respective tiles by trimming the connecting members 123 and 215 from respective leads connected to them.

In one aspect of the preferred embodiment, both ends of each cathode and anode leads protrude from respective lamp tiles. In other words, each cathode lead starts from one side of the lamp tile, extends across the lamp tile, and protrude from the other side of the lamp tile. Each anode lead also starts and ends on opposite sides of the respective lamp tile. In alternative embodiment, not all of the anode and cathode leads extend the length of the respective lamp tiles.

In another aspect of the preferred embodiment, when the trimmer 311 cuts the connecting members 123 and 215, each cathode lead has two ends, whereas each anode lead has only one end. In alternative embodiments, two ends are provided for each anode lead or only one end provided for each cathode lead. In any event, the ends of leads which protrude from the lamp tiles are bent downward to be inserted into a display board.

The novel design of the cathode and anode lead frames 101 and 201 of this invention allows the above described assembly line processing to be achieved. This assembly line processing further allows the subsequent post processing to take place. Hence, in the preferred embodiment the trimmed lamp tiles remain in the reels for further processing. In another embodiment, however, the trimmed lamp tiles are separated from the reels and stored for further processing.

Subsequent to the trimmer, the post processor performs a number of packaging functions on the lamp tiles. The packaging functions include a combination of inserting light lamps into the light openings 320, wire bonding 321, inserting clear epoxy into the light openings 323. The wire bonding process employs thin wires, preferably made from aluminum, to connect the exposed portions of the anode and cathode leads to respective anode and cathode ends of inserted lamps. The testing process 325 tests the integrity of lamp tiles such as non-conductivity between the anode and cathode leads and on/off states of the inserted light lamps.

After the post processing, the lamp tiles are ready to be mounted into a display board that is adapted to receive the lamp tiles and wired to control the lamp tiles and respective lamps.

One of ordinary skill in the art can envision numerous variations and modifications. For example, the cathode reel feeding holes ill and the alignment holes 113 can be located at different positions, or the cathode lead frame 101 can be overlaid on top of anode lead frame 201. All of these modifications are contemplated by the true spirit and scope of the following claims.

What is claimed is:

1. A system for fabricating a plurality of lamp tiles, said system comprising:

a plurality of first lead frame segments which define first apertures and include a plurality of first leads extending into said first lead frame apertures;

a plurality of second lead frame segments which define second apertures and including a plurality of second leads extending into said second lead frame apertures;

a plurality of pins configured to overlay one of said first and second lead frame segments;

a feeder for receiving said plurality of first and second lead frame segments and for overlaying said plurality of pins on one of said first and second lead frame segments such that corresponding said first and second leads form an array of intersections in a plan view of said overlaid lead frame segments, and are spaced apart from each other at each said intersection by a predetermined distance in a side view of said overlaid lead frame segments; and a molder configured to deposit molding material in a predetermined pattern on a plurality of said intersections such that a portion of each corresponding said first lead protrudes from said deposited molding material, and a portion of each corresponding said second lead protrudes from said deposited molding material.

2. The system of claim 1, further comprising a trimmer configured to cut said first and second leads from said first and second lead frame segments.

3. The system of claim 1, further comprising a first stamping device configured to stamp said first lead frame segments on a first elongated sheet made of electrically conductive rigid material, and a second stamping device configured to stamp said second lead frame segments on a second elongated sheet made of electrically conductive rigid material.

4. The system of claim 1, wherein said molding material is made from a high temperature nylon which is capable of withstanding up to 570° F.

5. The system of claim 1, further comprising means for forming a plurality of light openings over said plurality of intersections to expose portions of corresponding said first and second leads.

6. A system for fabricating a plurality of molded bodies having electrically conductive leads, said system comprising:

a plurality of first lead frame segments which define first apertures and include a plurality of first leads extending into said first lead frame apertures;

a plurality of second lead frame segments which define second apertures and including a plurality of second leads extending into said second lead frame apertures;

a plurality of pins configured to overlay one of said first and second lead frame segments;

a feeder for receiving said plurality of first and second lead frame segments and for overlaying said plurality of pins on one of said first and second lead frame segments such that corresponding said first and second leads form an array of intersections in a plan view of said overlaid lead frame segments, and are spaced apart from each other at each said intersection by a predetermined distance in a side view of said overlaid lead frame segments; and a molder configured to deposit molding material in a predetermined pattern on a plurality of said intersections such that a portion of each corresponding said first lead protrudes from said deposited molding material, and a portion of each corresponding said second lead protrudes from said deposited molding material.

7. The system of claim 6, further comprising a trimmer configured to cut said first and second leads from said first and second lead frame segments.

8. The system of claim 6, further comprising a first stamping device configured to stamp said first lead frame segments on a first elongated sheet made of electrically conductive rigid material, and a second stamping device configured to stamp said second lead frame segments on a second elongated sheet made of electrically conductive rigid material.

9. The system of claim 6, wherein said molding material is made from a high temperature nylon which is capable of withstanding temperatures up to 570° F.

10. The system of claim 6, further comprising means for forming a plurality of light openings over said plurality of intersections to expose portions of corresponding said first and second leads.

\* \* \* \* \*